(12) United States Patent
Lin

(10) Patent No.: US 7,220,680 B1
(45) Date of Patent: May 22, 2007

(54) METHOD FOR PHOTOLITHOGRAPHY IN SEMICONDUCTOR MANUFACTURING

(75) Inventor: Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/347,513

(22) Filed: Feb. 3, 2006

Related U.S. Application Data

(60) Provisional application No. 60/731,828, filed on Oct. 31, 2005.

(51) Int. Cl.
*H01L 21/312* (2006.01)

(52) U.S. Cl. ............ 438/745; 438/627; 438/678; 438/687; 257/40; 257/59; 257/72; 257/76; 257/347; 257/387; 430/311; 430/270.1

(58) Field of Classification Search ............ 257/40; 430/311; 438/745
See application file for complete search history.

(56) References Cited

U.S. PATENT DOCUMENTS

| | | | |
|---|---|---|---|
| 5,370,969 A | * | 12/1994 | Vidusek .............. 430/272.1 |
| 6,445,006 B1 | * | 9/2002 | Brandes et al. ............ 257/76 |
| 6,905,958 B2 | * | 6/2005 | Gracias et al. ............ 438/643 |
| 6,977,135 B2 | * | 12/2005 | Levenson ............ 430/311 |
| 7,008,872 B2 | * | 3/2006 | Dubin et al. ............ 438/678 |

OTHER PUBLICATIONS

Dutta, Proc. IEEE International Conference on Semiconductor Electronics, ICSE, Dec. 7-9, 2004 pp. 1-4.*
S. Wolf, Silicon Processing for the VLSI Era, Lattice Press (2986), p. 418-421).*

* cited by examiner

*Primary Examiner*—Lan Vinh
*Assistant Examiner*—Maki Angadi
(74) *Attorney, Agent, or Firm*—Haynes and Boone, LLP

(57) ABSTRACT

The present disclosure relates generally to the manufacturing of semiconductor devices. In one example, a method for forming a portion of a semiconductor device includes forming a photo sensitive layer over a substrate, developing the photo sensitive layer to expose a portion of the substrate and to create a seed layer from at least a portion of the photo sensitive layer remaining after the developing, forming an etch stop layer only on the seed layer, and etching the substrate using the etch stop layer as a mask.

24 Claims, 9 Drawing Sheets

METHOD FOR PHOTOLITHOGRAPHY IN SEMICONDUCTOR MANUFACTURING

CROSS REFERENCE

This application claims priority from U.S. Provisional Patent Application Ser. No. 60/731,828, filed on Oct. 31, 2005, which is incorporated by reference in its entirety.

BACKGROUND

One of the factors involved in the manufacture of semiconductor devices is a depth of focus (DOF) window. Generally, an effective DOF will cover all the variations of photoresist thickness, local substrate topology step height, and wafer center and edge step height differences. An effective DOF facilitates manufacturing a semiconductor device within a desired critical dimension (CD) specification with little or no scum or top loss defects.

Problems may occur with photoresist that is thicker than the DOF. For example, if the DOF is less than the thickness of the photoresist layer plus step height variation, scum or CD errors may occur in some of the patterns formed on the semiconductor devices. Therefore, thin layers of photoresist may be desired to counter this problem. Such thin photoresist layers may also be desirable for low dosage exposure tools, such as an e-beam or extreme ultraviolet (EUV) tools, as they may improve resist contrast, resolution, and dissolution. Moreover, for mass production purposes, the combination of thin photoresist layers and low dosage exposure tools can increase the throughput of semiconductor devices.

However, the use of thin photoresist layers can have drawbacks. For example, a thin photoresist layer may adversely affect etching performance if it does not provide sufficient protection during the etch process. To resolve this problem, a two step process may be used. For example, a relatively thin photo sensitive layer may be formed over a thick buffer layer. The photo sensitive layer is developed to form a predefined pattern, and the buffer layer is then etched to correspond to the pattern formed by the photo sensitive layer. The buffer layer then serves as an etch stop layer during etching of the substrate. Accordingly, two removal steps (developing and etching) are needed to reach the substrate prior to etching the substrate.

Therefore, what is needed is a new and improved photolithography process to address these drawbacks.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
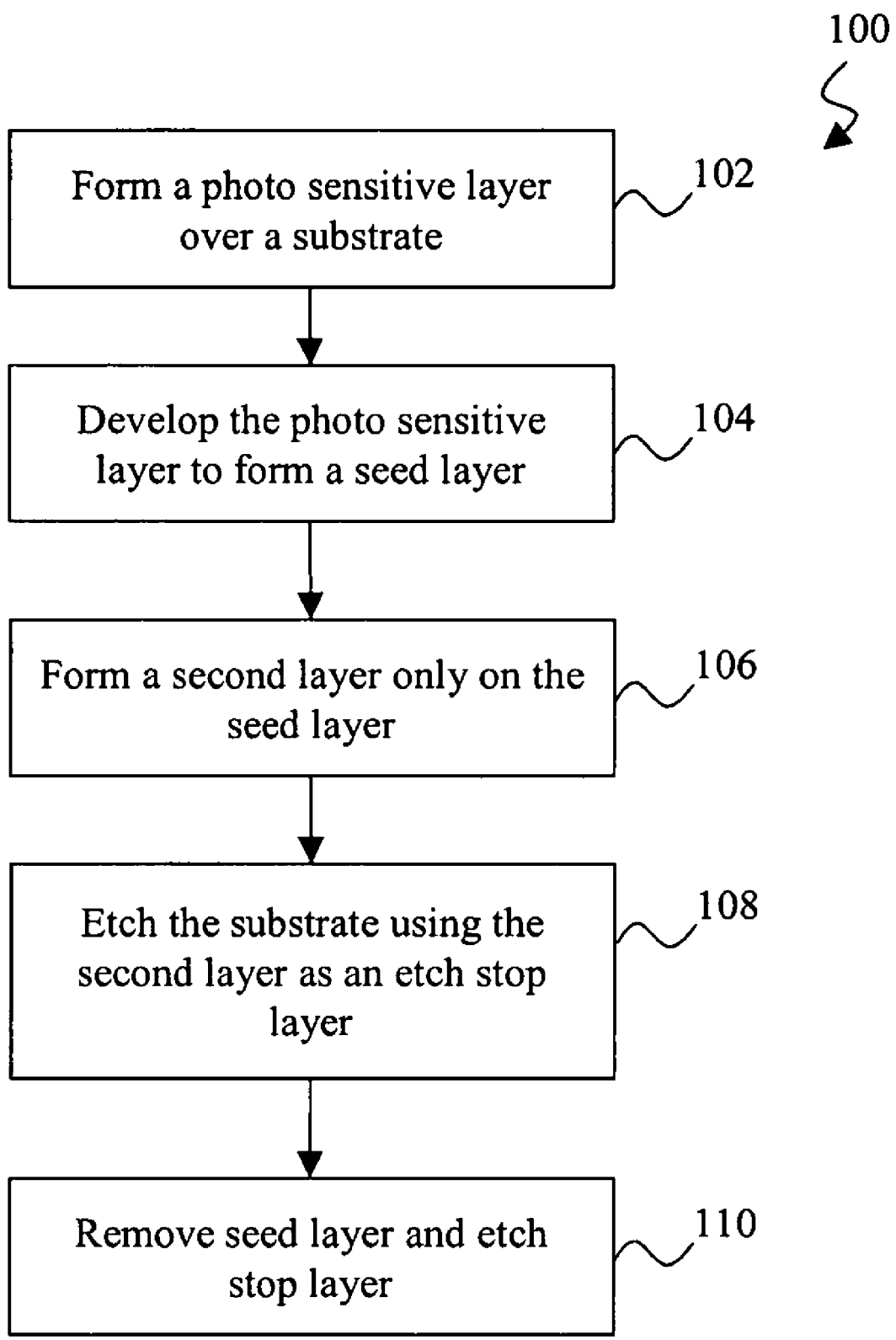
FIG. 1 illustrates a method for implementing one embodiment of the present invention during semiconductor manufacturing.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, in one embodiment, a method 100 may be used to obtain the benefits of a relatively thin photo sensitive layer while reducing the number of development/etch steps generally needed when using a photo sensitive layer and a buffer/etch stop layer. The method 100 is described in conjunction with FIGS. 2–7, which illustrate one embodiment of a semiconductor device 200 undergoing manufacture using the method 100. It is understood that the semiconductor device 200 is only one example of a device that may be manufactured using the method 100, and that other steps (e.g., rinsing) may be performed in addition to the steps described.

Figure 2:
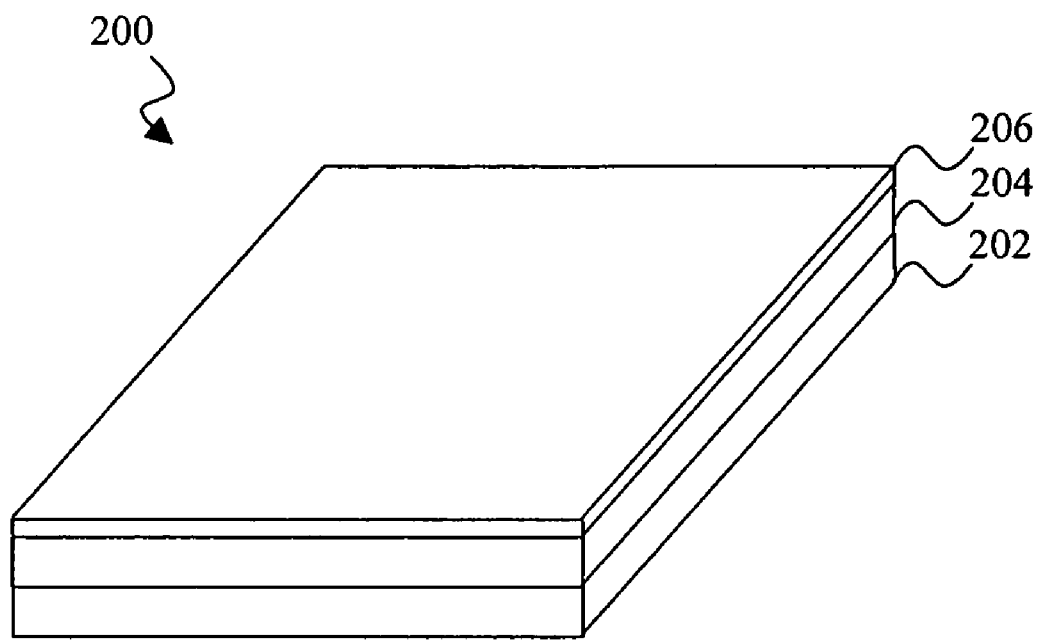
FIG. 2 is a perspective view of one embodiment of a partial semiconductor device with a photo sensitive layer overlying other layers undergoing manufacturing using the method of FIG. 1.

Referring to step 102 and with additional reference to FIG. 2, a photo sensitive layer 206 (e.g., a photoresist) is formed on an underlying layer 204. The layer 204 is positioned above another layer 202. The layer 204 may be formed of one or more insulator, conductor, and/or semiconductor layers. For example, the layer 204 may be formed of a conductor, and the layer 202 may be formed of an insulator having vias (not shown) that connect the layer 204 to conductive material (not shown) under the layer 202. In another embodiment, the layer 204 may be an insulator layer and the layer 202 may be a conductive layer. In still another embodiment, the layer 202 may be absent, and the layer 204 may include an elementary semiconductor material, such as crystal silicon, polycrystalline silicon, amorphous silicon, and/or germanium; a compound semiconductor, such as silicon carbide and/or gallium arsenic; or an alloy semiconductor, such as SiGe, GaAsP, AlInAs, AlGaAs, and/or GaInP. Further, the layer 204 may include a bulk semiconductor, such as bulk silicon, and such a bulk semiconductor may include an epi silicon layer. It may also or alternatively include a semiconductor-on-insulator substrate, such as a silicon-on-insulator (SOI) substrate, or a thin-film transistor (TFT) substrate. The layer 204 may also or alternatively include a multiple silicon structure or a multilayer compound semiconductor structure.

The formation of the photo sensitive layer 206 includes the deposition of a resist material (e.g., a positive resist or a negative resist); a polymer layer; and/or any other suitable materials. In the present example, the photo sensitive layer 206 is formed from a positive photoresist material and has a thickness of between 100 and 2000 angstroms. The resist material may be deposited and distributed over the surface of the layer 204 by a spin-on coating process and/or other processes. In one example, the photo sensitive layer 206 may be a chemically amplified resist that employs acid catalysis.

Figure 3:
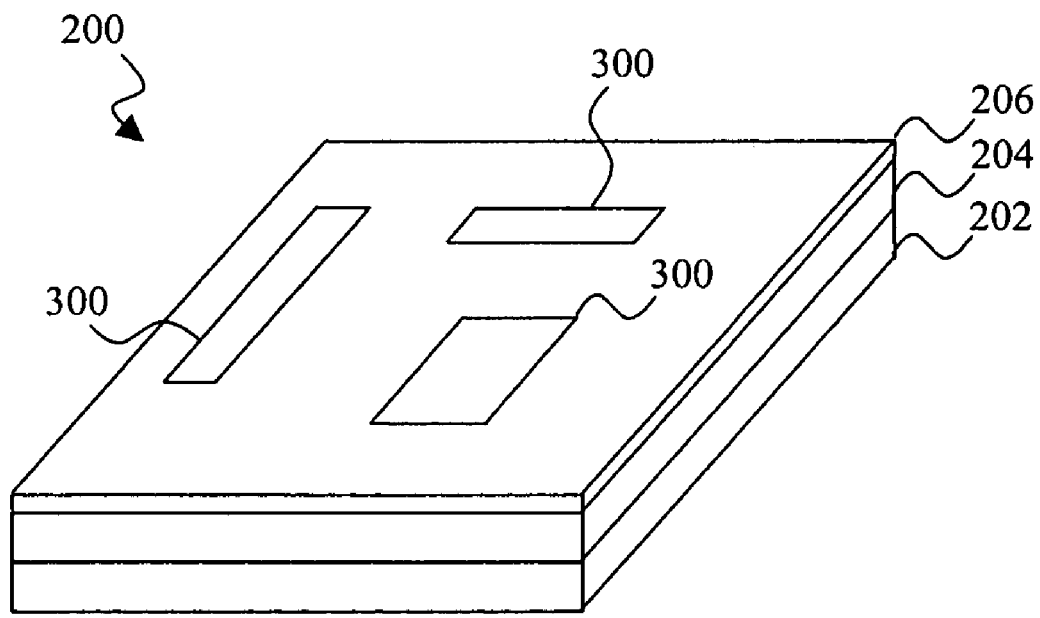
FIG. 3 is a perspective view of the partial semiconductor device of FIG. 2 illustrating a pattern formed on the photosensitive layer.
Figure 4:
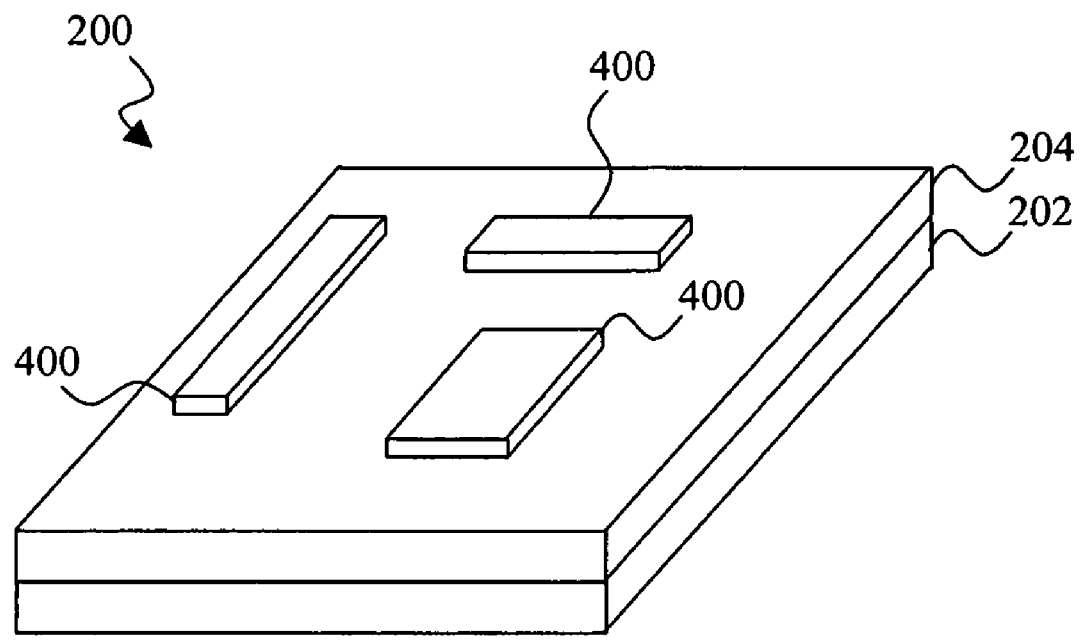
FIG. 4 is a perspective view of the partial semiconductor device of FIG. 3 after development of the photo sensitive layer based on the pattern.

In step 104 and with additional reference to FIGS. 3 and 4, a pattern 300 is formed on the photo sensitive layer 206 (FIG. 3) and the photo sensitive layer 206 is then developed (FIG. 4). The pattern may include lines, spaces, holes (e.g., vias), islands, or any other pattern. After patterning, the photosensitive layer 206 may undergo a development process to form a resist image as a seed layer 400. In the present embodiment, the resist is selected to be responsive to the photo sensitive material and provide a bond for subsequent process to grow thicker buffer layer from this resist image. In the present example, the seed layer 400 is approximately 100 to 2000 angstroms thick.

Figure 5:
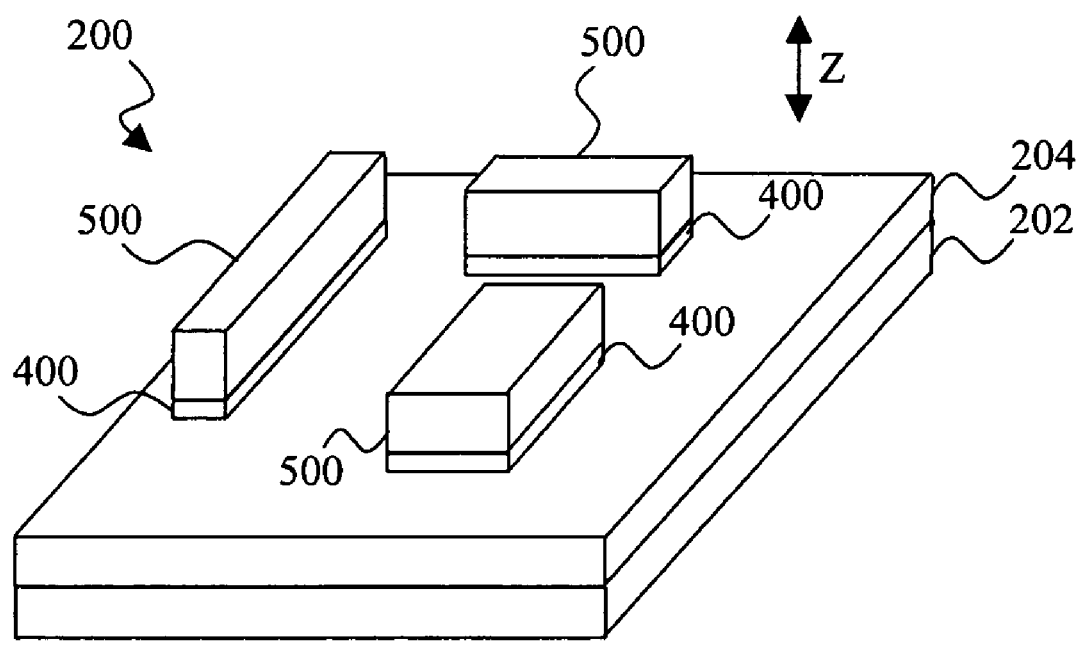
FIG. 5 is a perspective view of the partial semiconductor device of FIG. 4 after the formation of a second layer on the developed photo sensitive layer.

In step 106 and with additional reference to FIG. 5, a layer 500 may be formed on the seed layer 400. It is understood that, in the present embodiment, the layer 500 is formed only on the seed layer 400 and not on the exposed surfaces of the layer 204. The layer 500 may be formed using a variety of methods, and may be thicker and/or harder than the seed layer 400 after formation. As will be described below, the layer 500 may be used as an etch stop layer for a later etching process. Accordingly, the materials used to form the etch stop layer 500 may depend on the composition of the underlying layer to be etched (e.g., the layer 204) and the process used to etch the underlying layer. For example, the materials forming the etch stop layer 500 may be selected to have a particular composition if the layer 204 is a metal layer etched using a wet etch process, and a different composition if the layer 204 is an oxide layer etched using a dry etch process.

In one example, the layer 500 may be formed by exposing the seed layer 400 to a solution with a PH value of less than 7 or, in another example, with a PH value of 7 or greater. In still another example, the second layer 500 may be developed in a plasma environment using a process such as CVD. In yet another example, laser pulse vaporization may be utilized to selectively deposit the layer 500 using the seed layer 400.

The layer 500 may be formed by the use of long-chain molecules or long-chain polymer(s) in the Z direction as indicated in FIG. 5. For example, the long-chain molecules or polymers may include one or more carbon nanotubes, one or more ZnO nanotubes, aligned long-chain molecules, one or more aligned long-chain polymers, and/or any other suitable materials. It is contemplated that the thickness of the second layer 202 may be approximately between about 200 and about 600 nanometers. In still other embodiments, electro-less plating may be used to develop the etch stop layer. Alternatively, metal particles may be mixed into the photoresist to provide a metal base for electrode plating.

Figure 6:
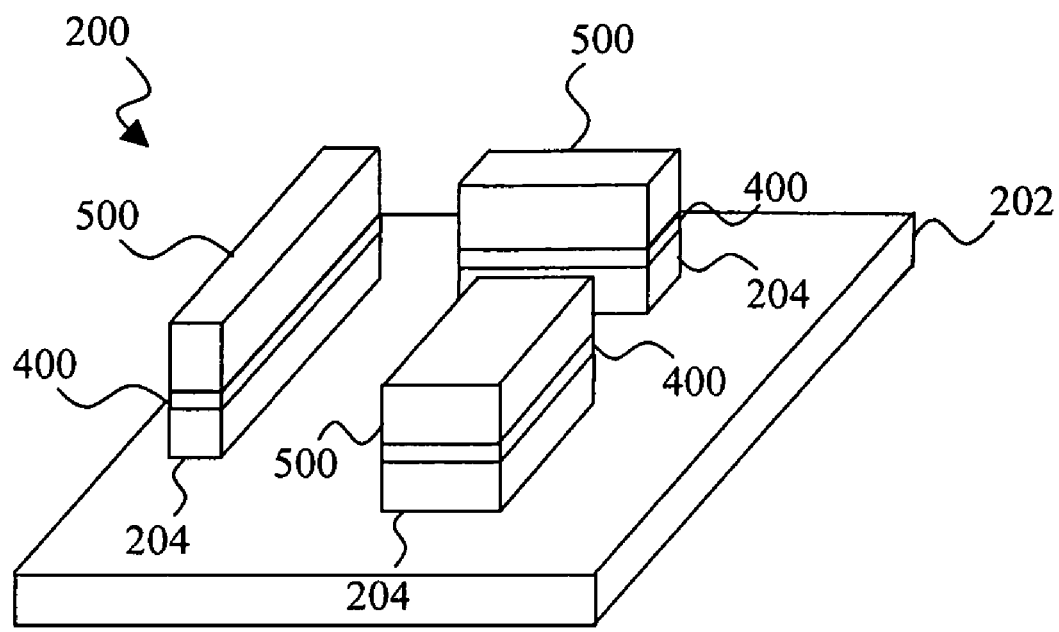
FIG. 6 is a perspective view of the partial semiconductor device of FIG. 5 after using the second layer as a mask during etching of the layer underlying the developed photo sensitive layer.

Referring to step 108 and with additional reference to FIG. 6, the layer 204 is etched using the layer 500 as an etch stop layer. The etching process may use one or more etching steps, including dry etching, wet etching, and/or other etching methods. Although the layer 204 is illustrated as completely etched in FIG. 6, it is understood that etching may be stopped when a desired amount of the layer 204 has been removed and the etching need not remove all of the exposed layer 204.

Figure 7:
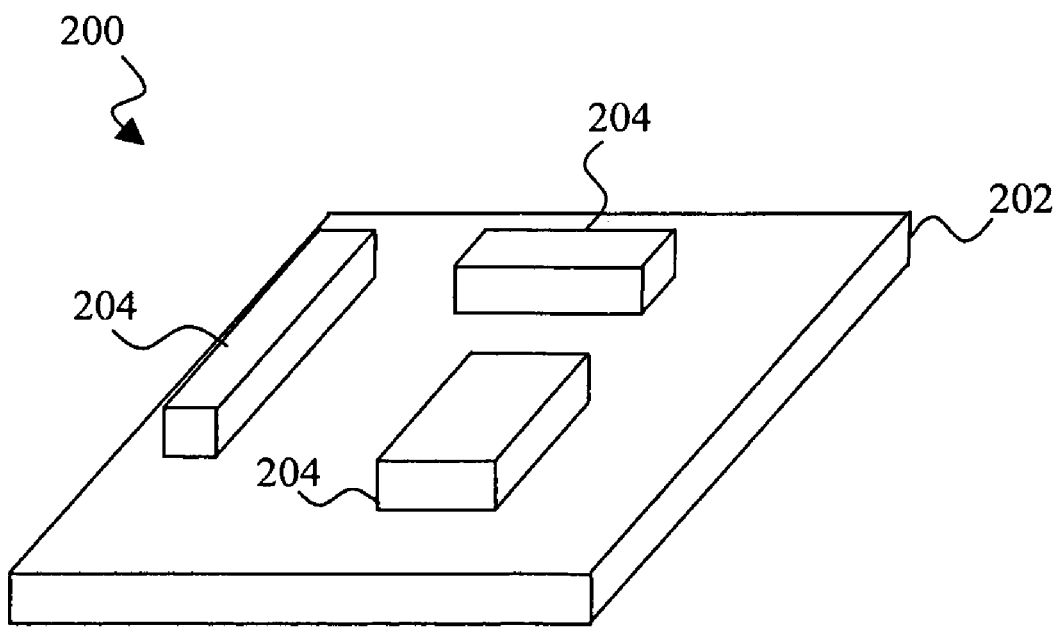
FIG. 7 is a perspective view of the partial semiconductor device of FIG. 6 after removal of the second layer and photo sensitive layer.

In step 110 and with additional reference to FIG. 7, the seed layer 400 and etch stop layer 500 may be removed by wet chemical etch and/or dry etch process.

Accordingly, using the method 100, an etch stop layer may be formed using a single development/etching step. It is understood that additional steps may be performed in order to complete the semiconductor device 200. Since those additional steps are known in the art and may vary depending on the specifics of the semiconductor device 200 being formed, they will not be further described herein. Furthermore, it is noted that many variations of the above example are contemplated herein. In one example, instead of utilizing the second layer 204 for etching purposes, it may be used for implanting purposes. In a second example, the second layer 204 may be a separate layer formed over the seed layer 400. In a third example, the second layer 204 may include the seed layer 400. Accordingly, a variety of modifications are contemplated by this disclosure.

Figure 8:
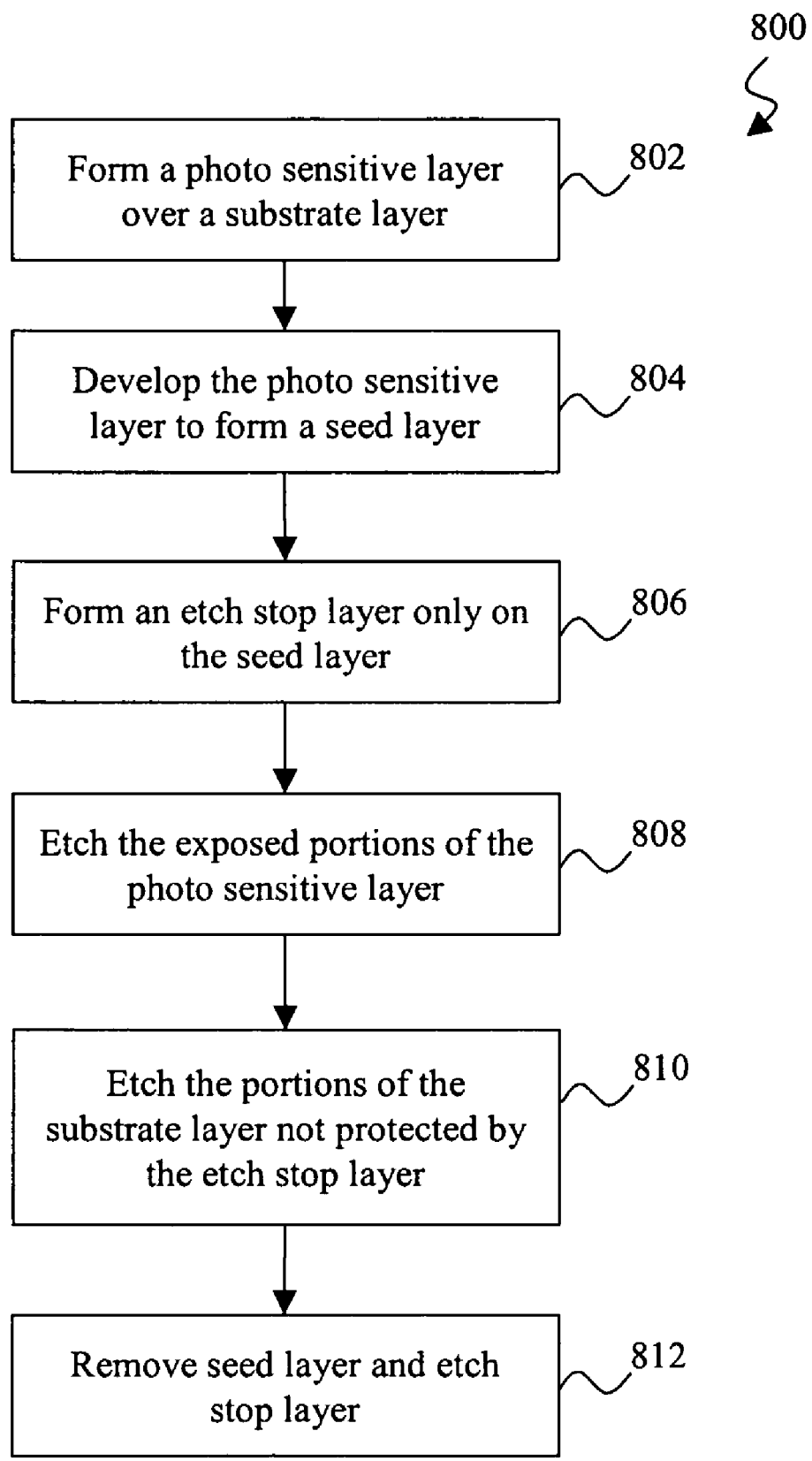
FIG. 8 illustrates a method for implementing another embodiment of the present invention during semiconductor manufacturing.

Referring to FIG. 8, in another embodiment, a method 800 may be used to obtain the benefits of a relatively thin photo sensitive layer while reducing the number of development/etch steps generally needed when using a photo sensitive layer and a buffer/etch stop layer. The method 800 is described in conjunction with FIGS. 9–14, which illustrate one embodiment of a semiconductor device 900 undergoing manufacture using the method 800. It is understood that the semiconductor device 900 is only one example of a device that may be manufactured using the method 800, and that other steps (e.g., rinsing) may be performed in addition to the steps described.

Figure 9:
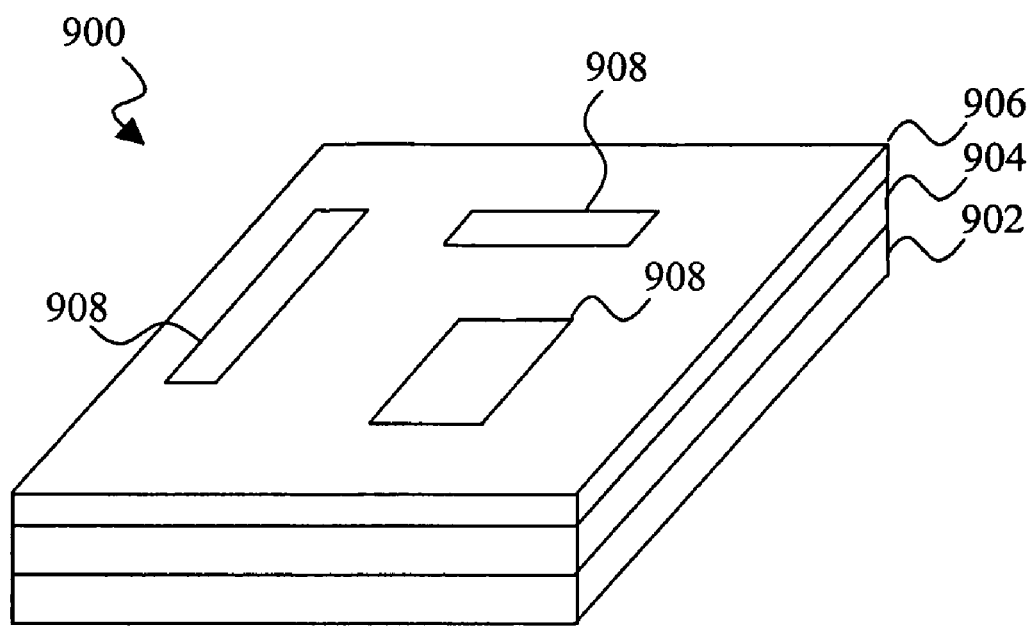
FIG. 9 is a perspective view of one embodiment of a partial semiconductor device with a photo sensitive layer overlying other layers undergoing manufacturing using the method of FIG. 8.

In step 802 and with additional reference to FIG. 9, a photo sensitive layer 906 (e.g., a photoresist) is formed on an underlying layer 904. The layer 904 may be formed of one or more insulator, conductor, and/or semiconductor layers. For example, the layer 904 may be formed of a conductor, and the layer 902 may be formed of an insulator having vias (not shown) that connect the layer 904 to conductive material (not shown) under the layer 902. In another embodiment, the layer 904 may be an insulator layer and the layer 902 may be a conductive layer. In still another embodiment, the layer 902 may be absent, and the layer 904 may include an elementary semiconductor material, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. Further, the layer 904 may include a bulk semiconductor, such as bulk silicon, and such a bulk semiconductor may include an epi silicon layer. It may also or alternatively include a semiconductor-on-insulator substrate, such as a silicon-on-insulator (SOI) substrate, or a thin-film transistor (TFT) substrate. The layer 904 may also or alternatively include a multiple silicon structure or a multilayer compound semiconductor structure.

The formation of the photo sensitive layer 906 includes the deposition of a resist material (e.g., a positive resist or a negative resist); a polymer layer; and/or any other suitable materials. In the present example, the photo sensitive layer 906 is formed from a negative photoresist material and has a thickness of between about 100 and about 2000 angstroms. The resist material may be deposited and distributed over the surface of the layer 904 by a spin-on coating process and/or other processes.

Figure 10:
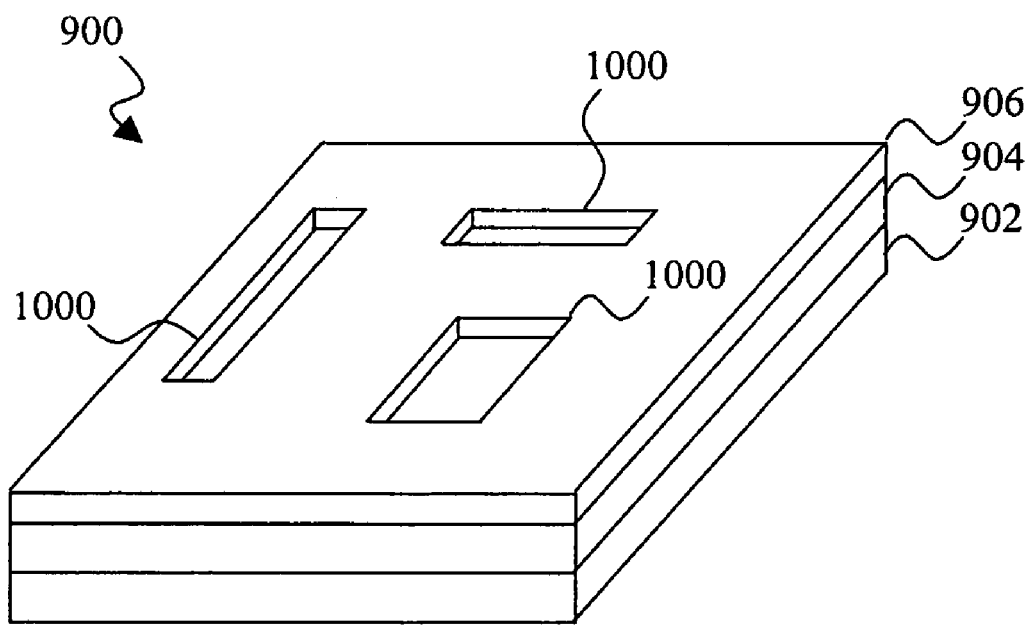
FIG. 10 is a perspective view of the partial semiconductor device of FIG. 10 after development of the photo sensitive layer based on a pattern.
Figure 11:
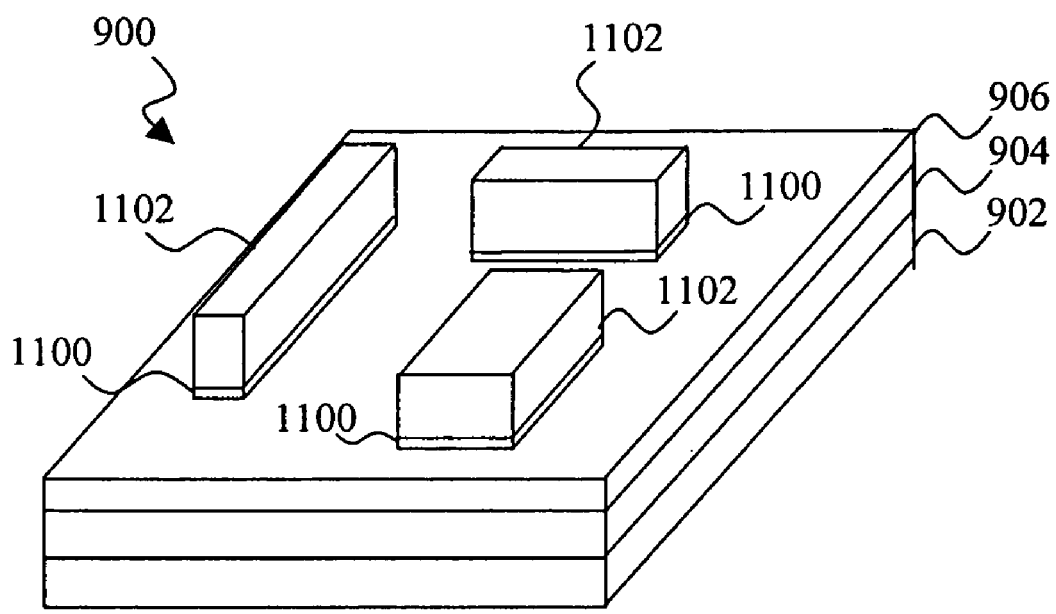
FIG. 11 is a perspective view of the partial semiconductor device of FIG. 10 after the formation of a second layer on a seed layer defined by the pattern.

In step 804 and with reference to FIGS. 9–11, a pattern 908 is formed on the photo sensitive layer 906 (FIG. 9) and the photo sensitive layer 906 is then developed (FIG. 10). The pattern may include lines, spaces, holes (e.g., vias), islands, or any other pattern. Because the photoresist layer 906 is formed from negative photoresist, the pattern 908 indicates areas where the photoresist is developed in order to be removed. Once removed, openings 1000 expose the metal of the underlying metal layer 904. After patterning and developing, the layer 904 may undergo a deposit or dip process to form a seed layer 1100 selectively on the exposed portions of the layer 904 (FIG. 11). It is understood that, in some embodiments, the layer 904 itself may serve as a seed layer, obviating the need for the formation of a seed layer. For example, the layer 904 may function as electrode plating and the etch stop layer 1102 may be formed therefrom using known electrode plating processes.

In step 806 and with continued reference to FIG. 11, a layer 1102 may be formed on the seed layer 1100. It is understood that, in the present embodiment, the layer 1102 is formed only on the seed layer 1100 and not on the exposed surfaces of the layer 906. The layer 1102 may be formed using a variety of methods, and may be thicker and/or harder than the seed layer 1100 after formation. As will be described below, the layer 1102 may be used as an etch stop layer for a later etching process. Accordingly, the materials used to form the etch stop layer 1102 may depend on the composition of the underlying layer to be etched and the process used to etch the underlying layer. The layer 1102 may be formed using one or more of a variety of processes, as described previously.

Figure 12:
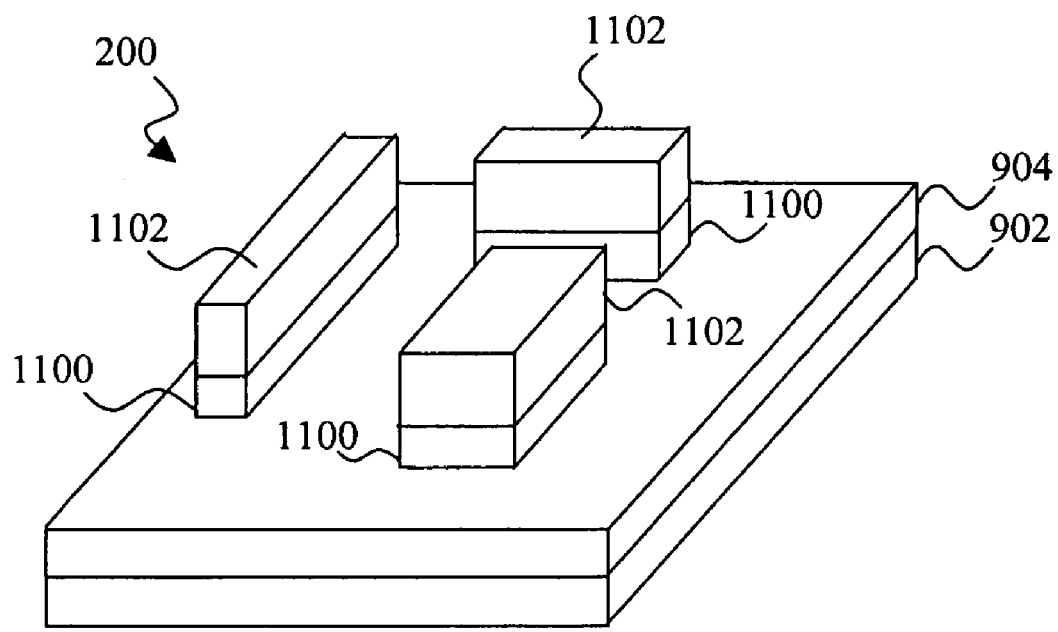
FIG. 12 is a perspective view of the partial semiconductor device of FIG. 11 after the remaining portions of the photosensitive layer have been removed.

In step 808 and with additional reference to FIG. 12, the photoresist layer 906 and underlying layer 908 may be removed. It is understood that, in some embodiments, the photoresist layer 906 may be removed prior to the formation of the etch stop layer 1102.

Figure 13:
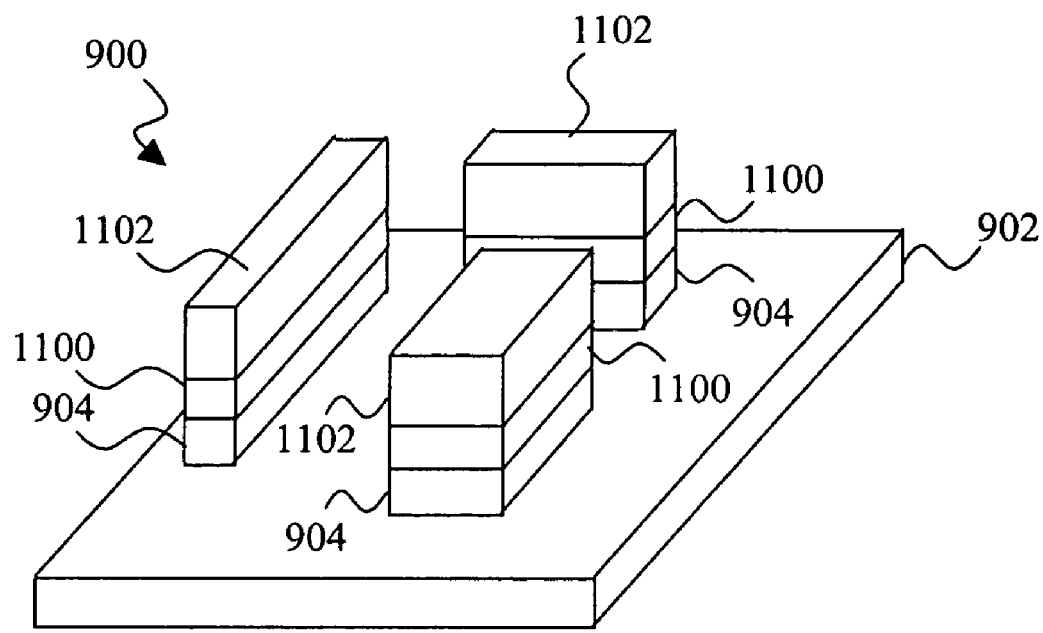
FIG. 13 is a perspective view of the partial semiconductor device of FIG. 12 after using the second layer as a mask during etching of the layer underlying the developed photo sensitive layer.
Figure 14:
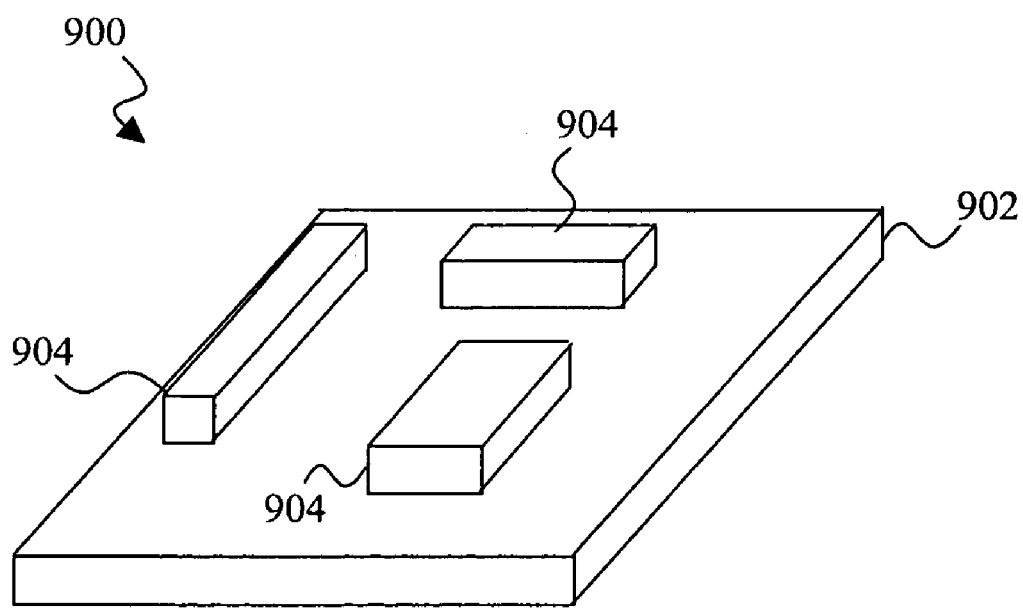
FIG. 14 is a perspective view of the partial semiconductor device of FIG. 13 after removal of the second layer.
Figure 15:
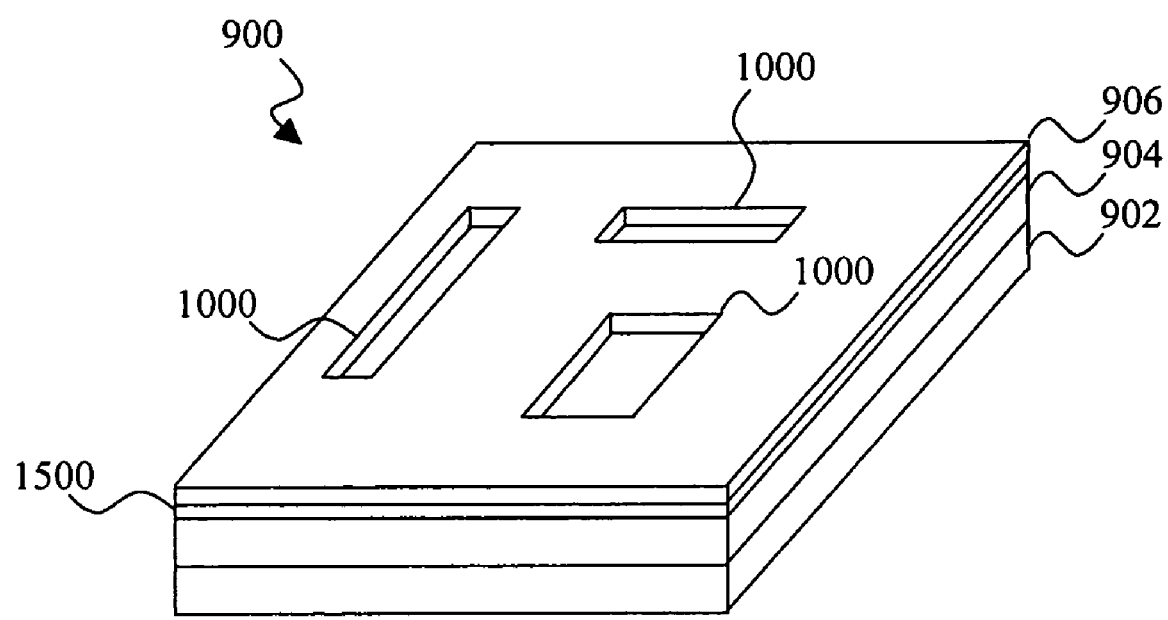
FIG. 15 is a perspective view of another embodiment of the partial semiconductor device of FIG. 9.

In step 810 and with additional reference to FIG. 13, the layer 904 is etched using the layer 1102 as an etch stop layer. The etching process may use one or more etching steps, including dry etching, wet etching, and/or other etching methods. Although the layer 904 is illustrated as completely etched in FIG. 13, it is understood that etching may be stopped when a desired amount of the layer 904 has been removed and the etching need not remove all of the exposed layer 904. Furthermore, in some embodiments, it is understood that the photoresist layer 906 and layer 904 may be removed in a single etching process. In step 812 and with additional reference to FIG. 14, the seed layer 1100 and etch stop layer 1102 may be removed to expose the remaining portions of the layer 904 for additional processing steps. Such removal may occur using chemical wet etch or dry etch ashing Referring to FIG. 15, in still another embodiment, an additional layer 1500 may be included between the photoresist layer 906 and the layer 904 of FIG. 9. In some examples, the layer 1500 may serve as a seed layer, and exposing a portion of the layer 1500 by developing the photoresist layer 906 may provide the previously described step of forming the seed layer. In such an example, the seed layer 1500 may function as electrode plating and the etch stop layer 1102 may be formed therefrom using known electrode plating processes. Once the etch stop layer 1102 has been formed, the remaining negative photoresist may be removed and the underlying metal and dielectric layers may be etched as previously described.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. A method for forming a portion of a semiconductor device, comprising:
    forming a photo sensitive layer over a substrate;
    developing the photo sensitive layer to expose a portion of the substrate;
    creating a seed layer from at least a portion of the photo sensitive layer remaining after the developing;
    growing an etch stop layer only on and from the seed layer; and
    etching the substrate using the etch stop layer as a mask.

2. The method of claim 1 wherein the etch stop layer is thicker than the seed layer.

3. The method of claim 1 wherein the etch stop layer is harder than the seed layer.

4. The method of claim 1 wherein the developed photo sensitive layer itself works as the seed layer.

5. The method of claim 1 wherein the forming includes using the seed layer as electrode plating to grow the etch stop layer.

6. The method of claim 1 wherein the forming includes dipping the seed layer in a solution.

7. The method of claim 5 wherein the solution has a PH that is not greater than about 7.

8. The method of claim 5 wherein the solution has a PH that is greater than about 7.

9. The method of claim 1 wherein the forming includes the formation of long-chain molecules.

10. The method of claim 1 wherein the forming includes the formation of one or more long-chain polymers.

11. The method of claim 1 wherein the forming includes the formation of at least one carbon nano tube.

12. The method of claim 1 wherein the forming includes the formation of at least one ZnO nano tube.

13. The method of claim 1 wherein the forming includes the formation of aligned long-chain molecules.

14. The method of claim 1 wherein the forming includes the formation of one or more aligned long-chain polymers.

15. The method of claim 1 wherein the etch stop layer serves as an implantation mask.

16. A method for forming a portion of a semiconductor device, comprising:

forming a photo sensitive layer over a substrate;

developing the photo sensitive layer to expose a portion of the substrate, wherein the exposed portion of the substrate forms a seed layer;

growing an etch stop layer from the seed layer and only on the seed layer; and etching the substrate using the etch stop layer as a mask.

17. The method of claim 16 further comprising removing a remaining portion of the photo sensitive layer after forming the etch stop layer.

18. The method of claim 16 further comprising removing a remaining portion of the photo sensitive layer prior to forming the etch stop layer.

19. The method of claim 16 wherein forming the photo sensitive layer over the substrate includes selecting a negative photoresist for use as the photo sensitive layer.

20. The method of claim 16 wherein forming the photo sensitive layer over the substrate includes selecting a positive photoresist for use as the photo sensitive layer.

21. A method for forming a partial semiconductor device, comprising:

providing a photo sensitive layer over a substrate;

patterning the photosensitive layer using a predefined pattern;

developing the photo sensitive layer to form a seed layer, wherein the seed layer corresponds to the predefined pattern and wherein the seed layer has a first thickness;

forming a thicker layer only over the seed layer by creating a plurality of long-chain molecules arranged to be substantially perpendicular to the seed layer, wherein the thicker layer has a second thickness that is greater than the first thickness.

22. The method of claim 21 wherein no material is removed from the partial semiconductor device between the steps of developing the photo sensitive layer and etching the substrate.

23. The method of claim 21 further comprising etching the substrate using the thicker layer as an etch mask layer.

24. The method of claim 21 further comprising implanting the substrate using the thicker layer as an implantation layer.

* * * * *